(12) United States Patent
Nakano

(10) Patent No.: US 8,806,107 B2
(45) Date of Patent: Aug. 12, 2014

(54) SEMICONDUCTOR INTEGRATED CIRCUIT AND METHOD OF CONTROLLING MEMORY

(75) Inventor: Hiroo Nakano, Ohigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 706 days.

(21) Appl. No.: 13/053,397

(22) Filed: Mar. 22, 2011

(65) Prior Publication Data

US 2012/0072646 A1    Mar. 22, 2012

(30) Foreign Application Priority Data

Sep. 22, 2010 (JP) .................................. 2010-211922

(51) Int. Cl.
*G06F 12/00* (2006.01)

(52) U.S. Cl.
USPC ............................. 711/103; 711/100; 711/154

(58) Field of Classification Search
CPC ..... G06F 12/00; G06F 12/0238; G06F 3/0679
USPC ................................... 711/100, 103, 154, 200
See application file for complete search history.

(56) References Cited

U.S. PATENT DOCUMENTS

| | | | | |
|---|---|---|---|---|
| 5,982,688 | A | * | 11/1999 | Han ............................... 365/203 |
| 5,991,200 | A | * | 11/1999 | Seki et al. ................. 365/185.18 |
| 6,253,281 | B1 | * | 6/2001 | Hall .............................. 711/112 |
| 6,453,397 | B1 | | 9/2002 | Okuda |
| 2002/0141236 | A1 | * | 10/2002 | Nakai et al. ............. 365/185.03 |
| 2004/0257874 | A1 | | 12/2004 | Tanaka et al. |

FOREIGN PATENT DOCUMENTS

| | | |
|---|---|---|
| JP | 02-176882 | 7/1990 |
| JP | 2004-319048 | 11/2004 |

OTHER PUBLICATIONS

Japanese Office Action for Japanese Application No. 2010-211922 mailed on Jan. 18, 2013.
Office Action received in corresponding Chinese Application No. 201110066579.8 mailed Nov. 22, 2013, and English translation thereof.

* cited by examiner

*Primary Examiner* — Tuan Thai
(74) *Attorney, Agent, or Firm* — White & Case LLP

(57) ABSTRACT

According to one embodiment, a semiconductor integrated circuit device includes a non-volatile memory, a storing module, and a processing module. The non-volatile memory is having a first area and a second area. The storing module is configured to store a second program for downloading a first program from an outside to the first area. The processing module is configured to execute the first and the second programs. The non-volatile memory is having a first area and a second area. The storing module is configured to store a second program for downloading a first program from an outside to the first area. The processing module is configured to execute the first and the second programs. The first area is capable of being written and erased by the first program, and the second area is not capable of being erased by the first program.

17 Claims, 8 Drawing Sheets

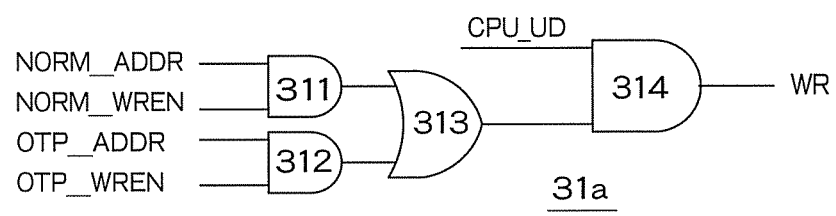
F I G. 2A
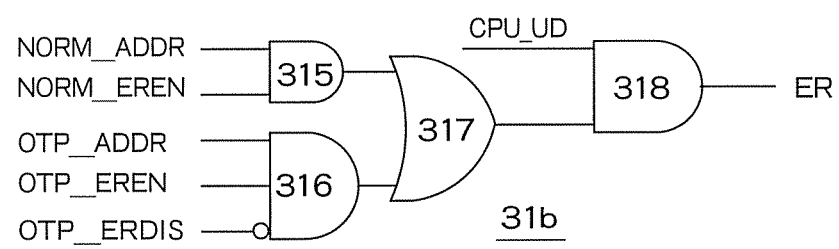
F I G. 2B

| SIGNAL NAME | DESCRIPTION |
|---|---|
| CPU_UD | HIGH PULSE SIGNAL IN SYNCHRONIZATION WITH REWRITING COMMAND OF CPU. (LOW AT NORMAL STATE, AND HIGH AT REWRITING) |
| NORM_ADDR | SIGNAL FOR SELECTING NORMAL AREA 21 IN EEPROM 2 (HIGH FOR SELECTING). |
| NORM_WREN | SIGNAL FOR ALLOWING WRITING NORMAL AREA 21 IN EEPROM 2 (HIGH FOR ALLOWING). CLEARED TO BE LOW WHEN BUSY SIGNAL RETURNED TO LOW FROM HIGH. CLEARED TO BE LOW WHEN PROGRAM OTHER THAN ROM 1 IS CALLED. DUE TO THIS FUNCTION, NORMAL AREA 21 CAN BE WRITTEN ONLY BY PROGRAM IN ROM 1 |
| OTP_ADDR | SIGNAL FOR SELECTING OTP AREA 22 IN EEPROM 2(HIGH FOR SELECTING). |
| OTP_WREN | SIGNAL FOR ALLOWING WRITING OTP AREA 22 IN EEPROM 2 (HIGH FOR ALLOWING). CLEARED TO BE LOW WHEN BUSY SIGNAL RETURNED TO LOW FROM HIGH. CLEARED TO BE LOW WHEN PROGRAM OTHER THAN ROM 1 IS CALLED. DUE TO THIS FUNCTION, OTP AREA 22 CAN BE WRITTEN ONLY BY PROGRAM IN ROM 1 |
| NORM_EREN | SIGNAL FOR ALLOWING ERASING NORMAL AREA 21 IN EEPROM 2 (HIGH FOR ALLOWING). CLEARED TO BE LOW WHEN BUSY SIGNAL RETURNED TO LOW FROM HIGH. CLEARED TO BE LOW WHEN PROGRAM OTHER THAN ROM 1 IS CALLED. DUE TO THIS FUNCTION, NORMAL AREA 21 CAN BE ERASED ONLY BY PROGRAM IN ROM 1 |
| OTP_EREN | SIGNAL FOR ALLOWING ERASING OTP AREA 22 IN EEPROM 2 (HIGH FOR ALLOWING). CLEARED TO BE LOW WHEN BUSY SIGNAL RETURNED TO LOW FROM HIGH. CLEARED TO BE LOW WHEN PROGRAM OTHER THAN ROM 1 IS CALLED. DUE TO THIS FUNCTION, OTP AREA 22 CAN BE ERASED ONLY BY PROGRAM IN ROM 1 |
| OTP_ERDIS | SIGNAL FOR FORBIDDING ERASING OTP AREA 22 IN EEPROM 2 (HIGH FOR FORBIDDING) SET TO BE LOW AT RESET, AND CANNOT BE SET TO BE LOW ONCE SET TO BE HIGH. |
| WR | SIGNAL FOR WRITING EEPROM (LOW AT NORMAL STATE, HIGH PULSE FOR STARTING WRITING) |
| ER | SIGNAL FOR ERASING EEPROM (LOW AT NORMAL STATE, HIGH PULSE FOR STARTING ERASING) |

F I G. 3

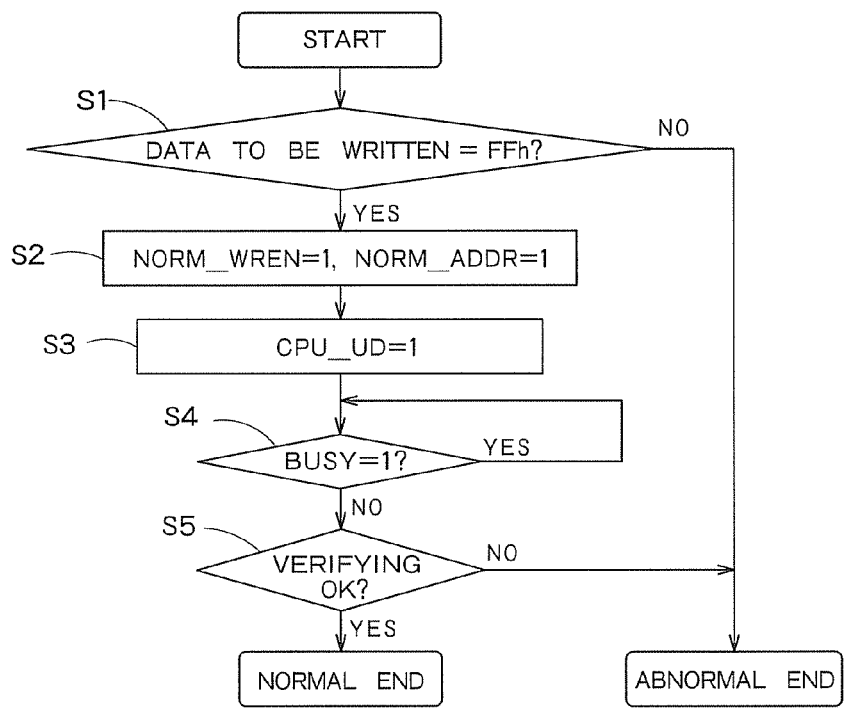
F I G. 4
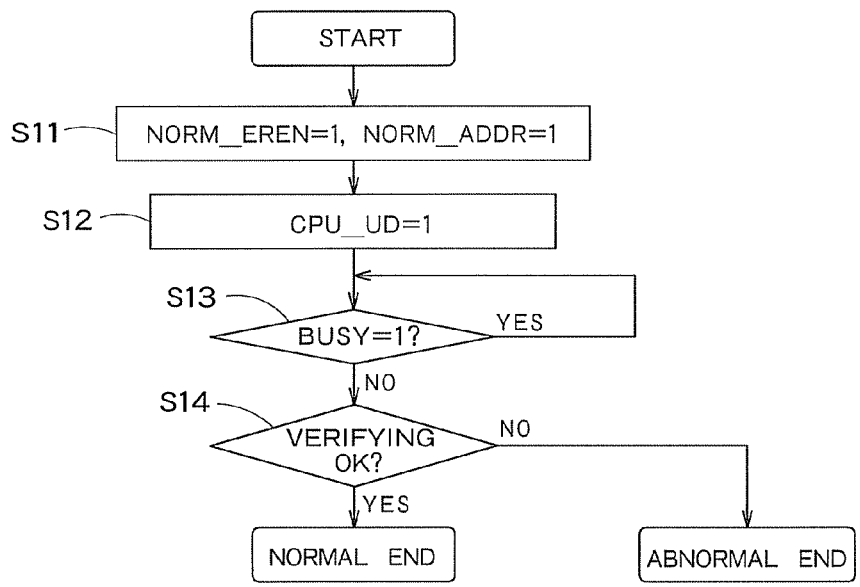
F I G. 5

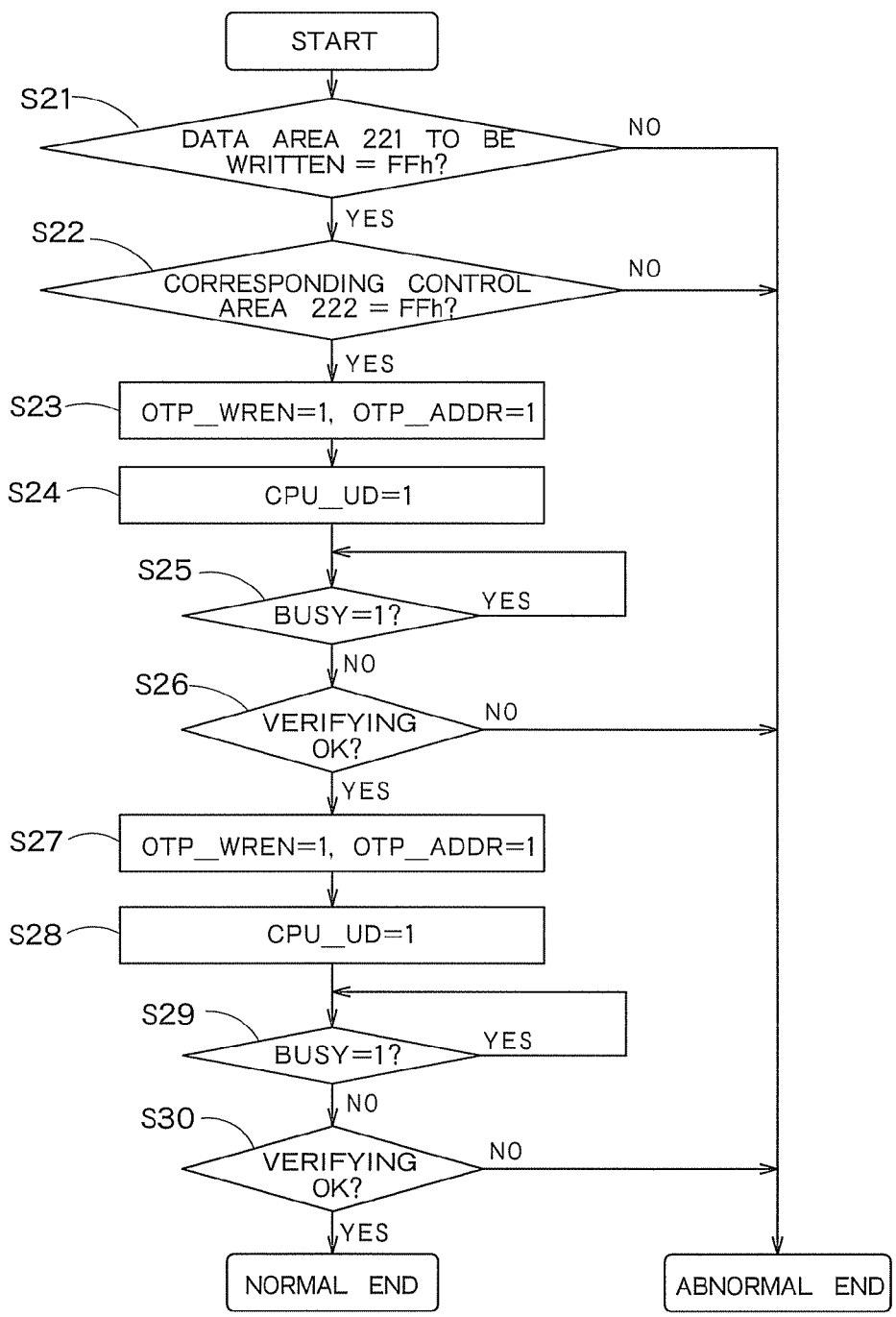
F I G. 6

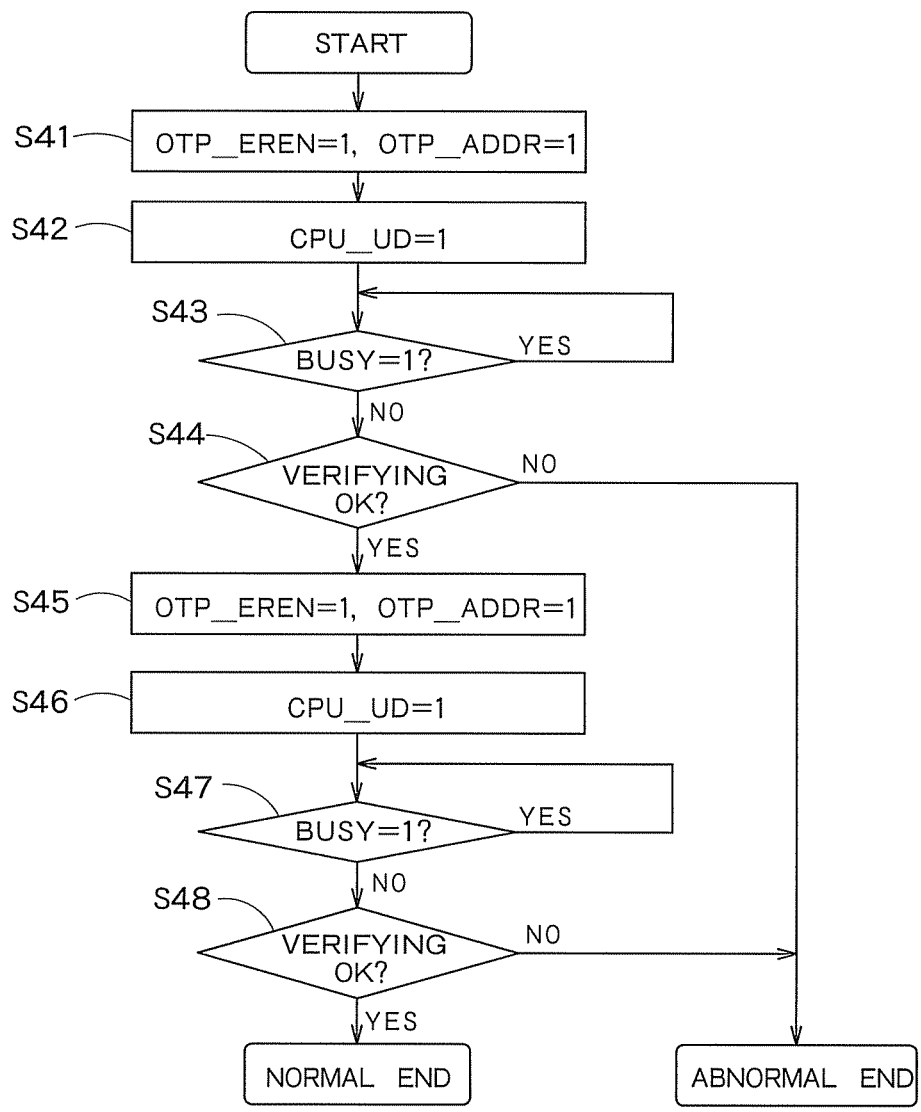
F I G. 7

|  | NORMAL AREA 21 | | OTP AREA 22 | |
| --- | --- | --- | --- | --- |
|  | WRITING | ERASING | WRITING | ERASING |
| PROGRAM IN ROM 1 | POSSIBLE | POSSIBLE | POSSIBLE | POSSIBLE WHEN OTP_ERDIS=0 IMPOSSIBLE WHEN OTP_ERDIS=1 |
| PROGRAM IN EEPROM 2 | IMPOSSIBLE | IMPOSSIBLE | IMPOSSIBLE | IMPOSSIBLE |
| EEPROM CONTROL ROUTINE 13 CALLED BY PROGRAM IN EEPROM 2 | POSSIBLE | POSSIBLE | POSSIBLE | IMPOSSIBLE |

F I G. 9

SEMICONDUCTOR INTEGRATED CIRCUIT AND METHOD OF CONTROLLING MEMORY

CROSS REFERENCE TO RELATED APPLICATIONS

This application is based upon and claims the benefit of priority from the prior Japanese Patent Application No. 2010-211922 filed on Sep. 22, 2010, the entire contents of which are incorporated herein by reference.

FIELD

Embodiments described herein relate generally to a semiconductor integrated circuit and a method of controlling a memory.

BACKGROUND

SIM (Subscriber Identity Module) is a kind of IC (Integrated Circuit) used for a cellular phone and so on. SIM card has, for example, an EEPROM (Electrically Erasable Programmable ROM) and an OTP (One Time Programmable ROM). The EEPROM is used as a writable and erasable non-volatile memory. The OTP is used as a non-volatile memory capable of being written only one time. Due to two kinds of non-volatile memories, control circuits for each memory are needed in addition to the kinds of non-volatile memories. Therefore, there are problems that a manufacturing cost of the IC increases and that a volume thereof becomes large.

BRIEF DESCRIPTION OF THE DRAWINGS

FIG. 2A is a circuit configuration of a circuit 31a for generating the writing signal WR.

FIG. 2B is a circuit configuration of a circuit 31b for generating the erasing signal ER.

FIG. 3 is a table showing each of signals of FIGS. 2A and 2B.

FIG. 4 is a flowchart showing the writing routine for the normal area 21.

FIG. 5 is a flowchart showing the erasing routine of the normal area 21.

FIG. 6 is a flowchart showing the writing routine for the OTP area 22.

FIG. 7 is a flowchart showing the erasing routine of the OTP area 22.

FIG. 9 is a table showing possibility/impossibility of rewriting the normal area 21 and the OTP area 22 by each program.

DETAILED DESCRIPTION

In general, according to one embodiment, a semiconductor integrated circuit device includes a non-volatile memory, a storing module, and a processing module. The non-volatile memory is having a first area and a second area. The storing module is configured to store a second program for downloading a first program from an outside to the first area. The processing module is configured to execute the first and the second programs. The non-volatile memory is having a first area and a second area. The storing module is configured to store a second program for downloading a first program from an outside to the first area. The processing module is configured to execute the first and the second programs. The first area is capable of being written and erased by the first program, and the second area is not capable of being erased by the first program.

Embodiments will now be explained with reference to the accompanying drawings.

Figure 1:
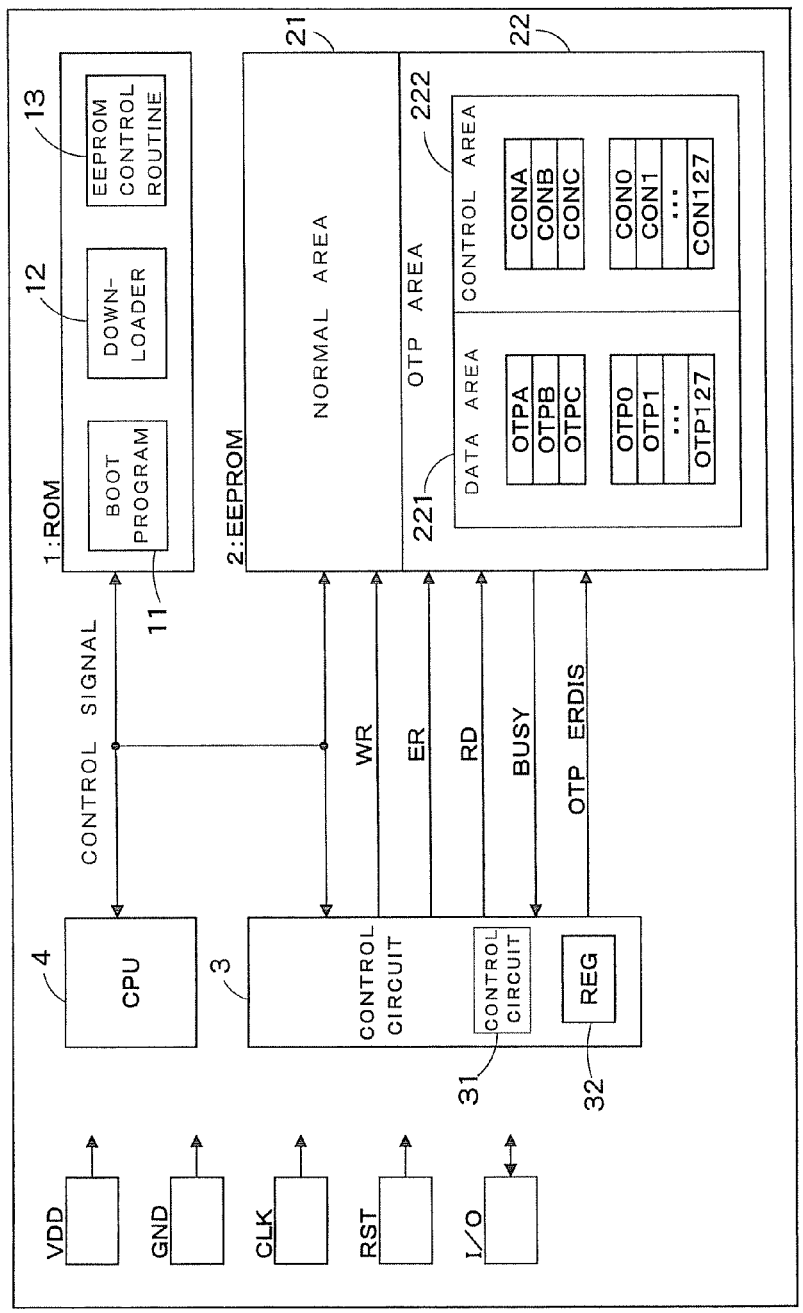
FIG. 1 is a block diagram showing a schematic configuration of a semiconductor integrated circuit device 100 according to an embodiment.

FIG. 1 is a block diagram showing a schematic configuration of a semiconductor integrated circuit device 100 according to an embodiment. The semiconductor integrated circuit device 100 of FIG. 1 is an IC mounted on a cellular phone, for example.

The semiconductor integrated circuit device 100 has a power source terminal VDD, a ground terminal GND, a clock terminal CLK, a reset terminal RST, and an I/O (input and output) terminal. A power source is supplied between the power source terminal VDD and the ground terminal GND. A clock signal is inputted to the clock terminal CLK, and a reset signal is inputted to the reset terminal RST from outside. Programs are inputted to the I/O terminal from the outside, for example. Furthermore, the semiconductor integrated circuit device 100 can have various terminals such as an SWP terminal (not shown) which inputs and outputs analog signals for high-speed data communication.

Additionally, the semiconductor integrated circuit device 100 has a ROM (Read Only Memory, storing module) 1, an EEPROM 2, a logic circuit 3, and a CPU (Central Processing Unit, processing module) 4. The semiconductor integrated circuit device 100 can further have an analog circuit (not shown) sending data to the logic circuit 3 and receiving the data therefrom, and a RAM (not shown) temporarily storing the data. Note that other non-volatile memory can be used instead of the EEPROM 2.

The ROM 1 stores three programs, that is, a boot program 11, a downloader (first program) 12, and an EEPROM control routine (second program) 13. The boot program 11 is a program executed firstly after releasing a reset by the reset signal RST. The downloader 12 is a program for downloading the program from the outside to the EEPROM 2. The EEPROM control routine 13 is a program for writing and erasing data in the EEPROM 2. The EEPROM control routine 13 is called by the downloader 12 or by the program downloaded in the EEPROM 2 (hereinafter, referred to as a "program in the EEPROM 2" or first program) to be used. These programs are executed by the CPU 4.

The EEPROM 2 is a writable and erasable non-volatile memory by a unit of a byte. The data stored in the EEPROM 2 in an initial state is high. The data can be set to be low by writing and set to be high by erasing. Hereinafter, "writing" means setting an area in the initial state to be high or low, and "erasing" means setting a written area to be high, which is the initial state. Furthermore, "rewriting" means writing and erasing.

The EEPROM 2 has a normal area (first area) 21 and an OTP area (second area) 22. Different addresses are assigned to each of the normal area 21 and the OTP area 22.

The normal area 21 stores the program downloaded from the outside and various data. The program downloaded in the EEPROM 2 is executed by the CPU 4. In the present embodiment, rewriting the OTP area 22 cannot be executed by the program in the EEPROM 2 directly, and only writing the OTP area 22 can be executed by calling the EEPROM control routine 13 stored in the ROM 1, which will be explained in detail below.

The OTP area 22 has a data area 221 and a control area 222. The data area 221 stores data OTPA to OTPC, OTP0 to OTP127, and the control area 222 stores history information CONA to CONC, CON0 to CON127, which correspond to the data OTPA to OTPC, OTP0 to OTP127, respectively. The size of each of the data and the history information is one byte.

The history information is a writing history of the corresponding data. More specifically, each of the history information CONA to CONC, CON0 to CON127 is FFh ("h" at the end means hexadecimal) when the corresponding data OTPA to OTPC, OTP0 to OTP127 is in the initial state, and becomes 00h when the corresponding data OTPA to OTPC, OTP0 to OTP127 is written. By using the history information, writing the corresponding data area 221 can be allowed or forbidden.

The data OTPA to OTPC in the data area 221 controls allowance and forbiddance for downloading the programs to the EEPROM 2. Furthermore, the data OTP0 to OTP127 store data which is not desired to be rewritten such as a phone number and a serial number because writing the data OTP0 to OTP127 can be forbidden by the history information CON0 to CON127 in the control area 222.

The logic circuit 3 has a control circuit 31. The control circuit 31 generates a writing signal WR, an erasing signal ER and a readout signal RD to supply them to the EEPROM 2 based on a busy signal BUSY supplied from the EEPROM 2 and on a control signal supplied from the CPU 4. Writing, erasing and reading-out are executed in synchronization with high pulses on the writing signal WR, the erasing signal ER and the readout sign RD, respectively. Furthermore, the busy signal BUSY of high means that the EEPROM 2 is under writing or erasing.

The logic circuit 3 has a register (REG) 32 storing a value of a signal OTP_ERDIS (erasing control signal) for forbidding the OTP area 22. When the signal OTP_ERDIS is low, erasing the OTP area 22 in the EEPROM 2 is allowed, and when low, forbidden.

FIGS. 2A and 2B are a circuit configuration of an example of the control circuit 31. FIG. 2A shows a circuit 31a for generating the writing signal WR, and FIG. 2B shows a circuit 31b for generating the erasing signal ER. FIG. 3 is a table showing each of signals of FIGS. 2A and 2B. Among signals inputted to the control circuit 31, signals NORM_ADDR, NORM_WREN, OTP_ADDR, OTP_WREN, NORM_EREN, OTP_EREN are generated by a signal generation circuit (not shown) in the logic circuit 3, and a signal CPU_UD is inputted from the CPU 4, and the signal OTP_ERDIS is stored in the register 32.

The circuit 31a FIG. 2A for generating the writing signal WR of has AND circuits 311, 312 and 314, and an OR circuit 313. The signals NORM_ADDR and NORM_WREN are inputted to the AND circuit 311. When both of these signals are high, the AND circuit 311 sets the output signal to be high. Similar to this, the signals OTP_ADDR and OTP_WREN are inputted to the AND circuit 312. When both of these signals are high, the AND circuit 312 sets the output signal to be high. When at least one of the outputs of the AND circuits 311 and 312 is high, the OR circuit 313 sets the output signal to be high. Furthermore, when the signal CPU_UD is high, the AND circuit 314 sets the writing signal WR to be high. At the same time, an address of the EEPROM 2 to be written is set by the CPU 4, and the data is written in the set address.

When the CPU 4 executes the EEPROM control routine 13, each of the signals inputted to the control circuit 31 of FIGS. 2A and 2B is controlled. The signal NORM_ADDR is set to be high when the address assigned to the normal area 21 in the EEPROM 2 is inputted from the CPU 4 to the logic circuit 3. The signal NORM_WREN is set to be high when a writing command to the normal area 21 is received from the CPU 4 and the busy signal BUSY is low. After that, the busy signal BUSY is set to be high during writing, and after completing writing, the busy signal BUSY is set to be low. In synchronization therewith, the signal NORM_WREN is set to be low. The signal CPU_UD is set to be high in synchronization with the rewriting command from the CPU 4.

The circuit 31b of FIG. 2B for generating the erasing signal ER is similar to the circuit 31a of FIG. 2A. A different point is that an inverted signal of the signal OTP_ERDIS stored in the register 32 is inputted to an AND circuit 316. When the signal OTP_ERDIS is high, the output signal of the AND circuit 316 is set to be low regardless of the value of the signal OTP_ADDR and that of the signal OTP_EREN. As a result, the OTP area 22 cannot be erased.

Here, when the program other than the program stored in the ROM 1, that is, the program in the EEPROM 2 is executed, the signals NORM_WREN, OTP_WREN, NORM_EREN, and OTP_EREN are set to be low. Because of this, the EEPROM 2 cannot be directly rewritten by the program in the EEPROM 2.

Note that by calling the EEPROM control routine 13 from the program in the EEPROM 2, it is possible to write the normal area 21 and the OTP area 22 in the EEPROM 2. Furthermore, as shown in FIG. 2B, the signal OTP_ERDIS only forbids erasing the OTP area 22, and it is possible to erase the normal area 21. Therefore, by calling the EEPROM control routine 13 from the program in the EEPROM 2, it is also possible to erase the normal area 21 in the EEPROM 2.

Next, a writing routine and an erasing routine for the normal area 21 and a writing routine and an erasing routine for the OTP area 22 using the control circuit 31 will be explained, respectively. These routines are included in the EEPROM control routine 13 of FIG. 1.

FIG. 4 is a flowchart showing the writing routine for the normal area 21.

Firstly, the logic circuit 3 reads out the data stored in an address to be written, and confirms that the readout data is FFh (Step S1). If the readout data is not FFh (Step S1—NO), the routine ends abnormally. This is because the data before writing is in initial state, that is, the data should be FFh.

If the readout data is FFh (Step S1—YES), the CPU 4 sends a writing-allowance signal of the normal area 21 to the logic circuit 3, which sets the signal NORM_WREN to be high. Furthermore, the CPU 4 sends the address of the normal area 21 to be written to the logic circuit 3, which sets the signal NORM_ADDR to be high (Step S2). As a result, the AND circuit 311 of FIG. 2A sets the output signal to be high, and the OR circuit 313 sets the output signal to be high.

Then, the CPU 4 sends a rewriting command to the logic circuit 3, which sets the signal CPU_UD to be high (Step S3). Because of this, the AND circuit 314 of FIG. 2A sets the writing signal WR to be high. Therefore, writing is executed.

During writing, the EEPROM 2 sets the busy signal BUSY to be high. Then, after completing writing, the EEPROM 2 sets the busy signal to be low. The logic circuit 3 waits until the busy signal becomes low (Step S4), the logic circuit 3 verifies the data written in the EEPROM 2. If there is an abnormality in the verified result (Step S5—NO), the routine ends abnormally, and if there are no abnormalities, the routine ends normally, which means completing writing.

FIG. 5 is a flowchart showing the erasing routine of the normal area 21. Because the area in which an arbitrary data has already been written is erased, the erasing routine of FIG.

5 differs from FIG. 4 in a point that the data stored in an address to be written is not confirmed. Since the other processing is similar to FIG. 4, the explanation will be omitted.

As stated above, the normal area 21 is used as a rewritable area having no limit of rewriting.

FIG. 6 is a flowchart showing the writing routine for the OTP area 22. As explained above, the OTP area 22 has the data area 221 and the control area 222 corresponding thereto storing the history information. Therefore, it is necessary to write the history information in the control area 222 after writing in the data area 221. Hereinafter, explanation common to the writing routine for the normal area 21 of FIG. 4 will be omitted.

Firstly, the logic circuit 3 reads out the data stored in the data area 221 to be written, and confirms that the readout data is FFh (Step S21). Furthermore, the logic circuit 3 reads out the history information of the control area 222 corresponding to the data area 221 to be written, and confirms that the readout data is FFh (Step S22). If the history information of the corresponding control area 222 is not FFh, the routine ends abnormally as the data has been already written (Step S2—NO). The reason why not only the data area 221 but also the control area 222 is confirmed is that FFh may be written in the data area 221 by chance.

If both of the data in the data area 221 to be written and the history information of the control area 222 corresponding thereto are FFh (Steps S21 and S22—YES), the CPU 4 sends a writing-allowance signal of the OTP area 22 to the logic circuit 3, which sets the signal OTP_WREN to be high. Furthermore, the CPU 4 sends the address of the data area 221 to be written to the logic circuit 3, which sets the signal OTP_ADDR to be high (Step S23). As a result, the AND circuit 312 of FIG. 2A sets the output signal to be high, and the OR circuit 313 sets the output signal to be high.

Then, the CPU 4 sends a rewriting command to the logic circuit 3, which sets the signal CPU_UD to be high (Step S24). Because of this, the AND circuit 314 of FIG. 2A sets the writing signal WR to be high. Therefore, writing is executed. After that, when the busy signal BUSY becomes low, the logic circuit 3 verifies the written data (Steps S25 and S26). By such a manner, the data is written in the data area 221.

Next, in order to write the history information indicating that the data area 221 has been written to the corresponding control area 222, the CPU 4 sends a writing-allowance signal to of the OTP area 22 to the logic circuit 3, which sets the signal OTP_WREN to be high. Furthermore, the CPU 4 sends the address of the control area 222 corresponding to the data area 221 having been written to the logic circuit 3, which sets the signal OTP_ADDR to be high (Step S27). For example, when the data OTP64 in the data area 221 is written, the CPU 4 sends the address corresponding to the history information CON64 to the logic circuit 3. By similar processing, the history information CON64 in the control area 222 is set to be 00h, and the history information, which indicates that the corresponding data OTP64 in the data area 221 has been written, is stored (Steps S28 to S30).

FIG. 7 is a flowchart showing the erasing routine of the OTP area 22. Because the area in which an arbitrary data has already been written is erased, the erasing routine of FIG. 7 differs from FIG. 6 in a point that the data to be erased is not confirmed. Since the other processing is similar to FIG. 6, the explanation will be omitted.

Figure 8:
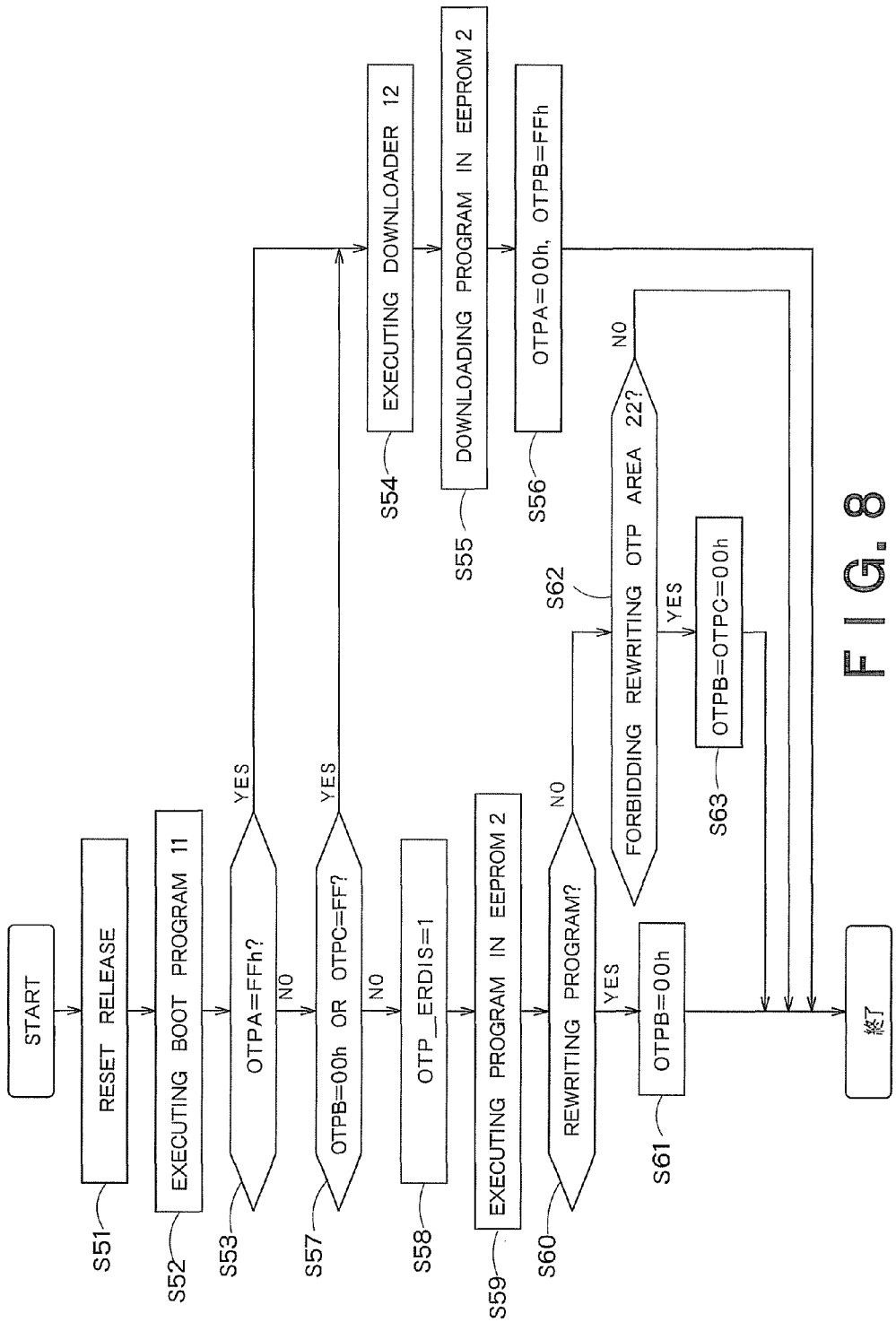
FIG. 8 is a flowchart showing the processing operation of each part of the semiconductor integrated circuit device 100 of FIG. 1.

FIG. 8 is a flowchart showing the processing operation of each part of the semiconductor integrated circuit device 100 of FIG. 1. With reference to FIG. 8, the processing operation of whole of the semiconductor integrated circuit device 100 will be explained. Note that OTPA (first data), OTPB (second data) and OTPC (third data) are set to be FFh in the semiconductor integrated circuit device 100 of FIG. 1 at shipment.

When a signal indicative of releasing the reset is inputted from the reset terminal RST (Step S51), the CPU 4 executes the boot program 11 (Step S52). The boot program 11 controls the CPU 4 to execute the downloader 12 or the program in the EEPROM 2 according to the values of the data OTPA to OTPC stored in the data area 221 in the OTP area 22, which will be explained below.

When the semiconductor integrated circuit device 100 operates at the first time after shipment, because OTPA=FFh (first value) (Step S53—YES), the CPU 4 executes the downloader 12 (Step S54). When the downloader 12 is executed, the program inputted through the I/O terminal from the outside is downloaded in the normal area 21 in the EEPROM 2 in accordance with the writing routine for the normal area 21 of FIG. 4 (Step S55). Furthermore, the data OTPA in the data area 221 is set to be 00h in accordance with the writing routine for the OTP area 22 of FIG. 6 (Step S56). When the data OTPA in the data area 221 is written once after shipment, the data OTPA is never rewritten.

When the semiconductor integrated circuit device 100 operates secondly, the reset is released and the boot program 11 is executed (Steps S51 and S52), because OTPA=00h (second value), (Step S53—NO) and OTPB=FFh (Step S57-NO), the CPU 4 executes the program in the EEPROM 2 (Step S59) after setting the signal OTP_ERDIS to be high (Step S58).

When the signal OTP_ERDIS is once set to be high, the signal OTP_ERDIS is not set to be low except by the reset. Like this, before executing the program in the EEPROM 2, the signal OTP_ERDIS is set to be high. Therefore, when the program in the EEPROM 2 is executed, the output signal of the AND circuit 316 of FIG. 2B is always set to be low, and the OTP area 22 cannot be erased. As a result, erasing the OTP area 22 can be forbidden.

Here, when the program in the EEPROM 2 is desired to be rewritten (Step S60—YES), the data OTPB in the data area 221 is set to be 00h (third value) in accordance with the writing routine for the OTP area 22 of FIG. 6 (Step S61). This writing is executed by calling the EEPROM control routine 13 from the program in the EEPROM 2.

In this state, when the reset is released and the boot program 11 is executed (Steps S51 and S52), because OTPA=00h (Step S53—NO), OTPB=00h and OTPC=FFh (Step S57—YES), the CPU 4 executes the downloader 12 (Step S54). Because of this, another program is downloaded from the outside again to the EEPROM 2 (Step S55). Furthermore, the CPU 4 erases the data OTPB to set it to be FFh (fourth value) in the data area 221 in accordance with the erasing routine of the OTP area 22 of FIG. 7 (Step S56).

As long as not forbidding rewriting, the program in the EEPROM 2 can be rewritten as many times as desired by processing of Steps S60 and S61.

On the other hand, after downloading the program to the EEPROM 2, when rewriting the program is desired to be forbidden (Step S62—YES), the data OTPB and OTPC in the data area 221 are set to be 00h (fifth value) (Step S63). Writing for setting these data to be 00h is executed by calling the EEPROM control routine 13 from the program in the EEPROM 2, or executed by a function of the downloader 12.

In this state, when the reset is released and the boot program 11 is executed (Steps S51 and S52), because OTPA=00h (Step S53—NO), OTPB=OTPC=00h (Step S57—YES), the CPU 4 executes the program in the EEPROM 2 (Step S59)

after setting the signal OTP_ERDIS to be high (Step S58). By such a manner, rewriting the program in the EEPROM 2 is forbidden.

For rewriting the program in the EEPROM 2, the data OTPC in the data area 221 should be erased to be set FFh in order to proceed to the processing of Step S57—YES. However, before executing the program in the EEPROM 2, the signal OPT_ERDIS is always set to be high (Step S58).

Therefore, the output signal of the AND circuit 316 in the control circuit 31 of FIG. 2B is always set to be low, and the data OTPC in the data area 221 in the OTP area 22 cannot be rewritten from the program in the EEPROM 2. Accordingly, the result of the processing of Step S57 of FIG. 8 becomes "NO", which causes that the program in the EEPROM 2 cannot be rewritten. Furthermore, if the program in the EEPROM 2 calls the downloader 12, because the signal OTP_ERDIS is set to be high (Step S58) before executing the program (Step S59), the data OTPC in the data area 221 cannot be erased. Because of this, rewriting the program is forbidden and unauthorized rewriting and so on can be prevented.

Furthermore, because the signal OTP_ERDIS is high, the data OTP0 to OTP127 in the data area 221 and the data of the control information CON0 to CON127 in the control area 222 cannot be erased. Therefore, because the result of the processing of Step S22 of FIG. 6 becomes "NO", new data cannot be written in the data area 221 the history information corresponding to which is set to be 00h by writing once.

As explained above, the processing of Step S63 of FIG. 8 is performed once and the data OTCP is set to be 00h, not only the program in the EEPROM 2 cannot be rewritten, but also the data OTP0 to OTP127 in the data area 221 in the OTP area 22 cannot be rewritten. Thus, the OTP area 22 in the EEPROM 2 can be used as an area where rewriting can be forbidden. For example, by setting OTPB=OTPC=00h after writing in the data area 221, the OTP area 22 can be used as an area capable of being written only once.

FIG. 9 is a table showing possibility/impossibility of rewriting the normal area 21 and the OTP area 22 by the program in the ROM 1 (that is, the boot program 11, the downloader 12 and the EEPROM control routine 13), the program in the EEPROM 2 and the EEPROM control routine 13 called by the program in the EEPROM 2, which collects the above description.

As shown in FIG. 9, the normal area 21 and the OTP area 22 cannot be rewritten directly by the program in the OTP area 22. This is because, as shown in FIG. 3, when the program in the EEPROM 2 is executed, the signals NORM_WREN, NORM_EREN, OTP_WREN and OTP_EREN are set to be low, respectively.

On the other hand, by calling the EEPROM control routine 13 from the program in the EEPROM 2, the normal area 21 can be rewritten and the OTP area 22 can be written. However, the OTP area 22 cannot be erased. This is because, as shown in FIG. 8, the signal OTP_ERDIS for forbidding erasing the OTP area 22 is set to be high (Step S58) before executing the program in the EEPROM 2 (Step S59).

Contrarily, the normal area 21 and the OTP area 22 can be rewritten by the program in the ROM 1 except the program in the ROM 1 is called from that in the EEPROM 2. As described above, when the program in the ROM 1 is called from that in the EEPROM 2, the OTP area 22 cannot be erased because the signal OTP_ERDIS is set to be high.

As stated above, in the present embodiment, the normal area 21 and the OTP area 22 are provided in the EEPROM 2. Before executing the program in the EEPROM 2, the signal OTP_ERDIS for forbidding erasing the OTP area 22 is set to be high. Therefore, the program in the EEPROM 2 cannot erase the OTP area 22. Accordingly, the normal area 21 in the EEPROM 2 can be used as a non-volatile memory having no limit of rewriting, and the OTP area 22 can be used as a non-volatile memory capable of being written only one time. As a result, it is unnecessary to integrate two kinds of non-volatile memories, that is, a rewritable non-volatile memory and a non-volatile memory rewriting which can be forbidden, thereby decreasing a manufacturing cost and miniaturizing the volume of the semiconductor integrated circuit device.

Furthermore, because the executed program is switched according to the data OTPA to OTPC in the data area 221, it is possible to easily control allowance and forbiddance of downloading the program to the EEPROM 2.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit device comprising:
   a non-volatile memory having a first area and a second area;
   a storing module configured to store a second program for downloading a first program from an outside to the first area; and
   a processing module configured to execute the first and the second programs,
   wherein the first area is capable of being written and erased by the first program, and the second area is not capable of being erased by the first program,
   the processing module is configured to determine whether to download the first program to the first area according to data stored in the second area,
   the second area is erased according to an erasing control signal, and
   the processing module is configured to set the erasing control signal in such a manner that the second area is not erased before executing the first program when the processing module determines not to download the first program to the first area.

2. The device of claim 1, wherein the storing module is configured to store a third program for rewriting the non-volatile memory, and
   the first area is capable of being written and erased by calling the third program from the first program.

3. The device of claim 1, wherein the second area is erased according to an erasing control signal, and
   the processing module is configured to set the erasing control signal in such a manner that the second area is not erased before executing the first program.

4. The device of claim 1, wherein the second area is configured to comprise:
   a data area configured to store the first to the third data; and
   a control area configured to store history information of each of the first to the third data.

5. The device of claim 1, wherein the second area is configured to comprise:
   a data area configured to store a plurality of data; and
   a control area configured to store history information of each of the plurality of data.

6. The device of claim 5, wherein when the processing module rewrites one of the plurality of data, the processing module is configured to rewrite the corresponding history information to a value indicating that the one of data is rewritten.

7. A semiconductor integrated circuit device comprising:
a non-volatile memory having a first area and a second area;
a storing module configured to store a second program for downloading a first program from an outside to the first area; and
a processing module configured to execute the first and the second programs,
wherein the first area is capable of being written and erased by the first program, and the second area is not capable of being erased by the first program,
the processing module is configured to determine whether to download the first program to the first area according to data stored in the second area,
the second area is configured to store:
first data configured to download the first program to the first area at an initial operation;
second data configured to control whether to rewrite the first program downloaded in the first area; and
third data configured to forbid rewriting the first program downloaded in the first area.

8. The device of claim 7, wherein the processing module is configured to download the first program and rewrite the first data to a second value indicative of not downloading the first program when the first data is a first value indicative of downloading the first program.

9. The device of claim 7, wherein the processing module is configured to rewrite the second data to a third value indicative of rewriting the first program in a case of rewriting the first program.

10. The device of claim 9, wherein the processing module is configured to download the first program and rewrite the second data to a fourth value indicative of not rewriting the first program when the second data is the third value.

11. The device of claim 7, wherein the processing module is configured to rewrite the third data to a fifth value indicative of forbidding rewriting the first program in a case of forbidding rewriting the first program.

12. A method of controlling a memory, the memory comprising a first area to which a first program is downloaded and a second area erased according to an erasing control signal, comprising:
setting the erasing control signal in such a manner that the second area is not erased; and
executing the first program downloaded to the first area after the erasing control signal is set;
determining whether to rewrite the first program according to data stored in the second area,
wherein upon executing the first program, a second data stored in the second area is rewritten to a third value indicative of rewriting the first program when the first program is rewritten, and
whether to rewrite the first program is determined according to the second data.

13. The method of claim 12 further comprising:
rewriting the first program according to a determination result of whether to rewrite the first program; and
rewriting the second data to a fourth value indicative of not rewriting the first program.

14. The method of claim 13 further comprising:
rewriting the first program according to a determination result of whether to rewrite the first program; and
rewriting the second data to a fourth value indicative of not rewriting the first program.

15. The method of claim 14, wherein upon rewriting the second data, the second data is rewritten by calling a third program for rewriting the memory from the first program.

16. The method of claim 14, wherein upon rewriting the second data, the second data and history information of the second data are rewritten.

17. The method of claim 12, wherein upon executing the first program, a third data stored in the second area is rewritten to a fifth value indicative of forbidding rewriting the first program in a case of forbidding rewriting the first program, and
whether to rewrite the first program is determined according to the third data.

* * * * *